(12) United States Patent
Kato

(10) Patent No.: US 9,694,537 B2
(45) Date of Patent: Jul. 4, 2017

(54) BONDING METHOD AND METHOD OF MANUFACTURING MICROCHANNEL DEVICE

(71) Applicant: FUJIFILM Corporation, Tokyo (JP)

(72) Inventor: Kota Kato, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 237 days.

(21) Appl. No.: 14/581,814

(22) Filed: Dec. 23, 2014

(65) Prior Publication Data

US 2015/0183154 A1 Jul. 2, 2015

(30) Foreign Application Priority Data

Dec. 26, 2013 (JP) .................................. 2013-269638

(51) Int. Cl.
*B32B 41/00* (2006.01)
*B29C 65/08* (2006.01)
(Continued)

(52) U.S. Cl.
CPC ........ *B29C 65/08* (2013.01); *B01L 3/502707* (2013.01); *B29C 65/7829* (2013.01);
(Continued)

(58) Field of Classification Search
CPC . B29C 65/08; B29C 65/7829; B29C 66/9492; B29C 66/53461; B29C 66/9517;
(Continued)

(56) References Cited

U.S. PATENT DOCUMENTS

| 5,658,408 A | 8/1997 | Frantz et al. |
| 6,066,216 A | 5/2000 | Ruppel, Jr. |
| 6,152,350 A | 11/2000 | Hayashi et al. |

FOREIGN PATENT DOCUMENTS

| JP | 3-183527 A | 8/1991 |
| JP | 11-10738 A | 1/1999 |

(Continued)

OTHER PUBLICATIONS

Extended European Search Report dated May 11, 2015, issued in corresponding European Patent Application No. 14199585.2.
(Continued)

*Primary Examiner* — Michael N Orlando
*Assistant Examiner* — Joshel Rivera
(74) *Attorney, Agent, or Firm* — Birch, Stewart, Kolasch & Birch, LLP

(57) ABSTRACT

A bonding method includes ultrasonically welding a protruding portion extending on a surface of a first substrate member to a surface of a second substrate member by applying ultrasonic vibration to the first substrate member. A protruding stopper portion for stopping welding is provided on the surface of the first substrate member formed with the protruding portion, or on the surface of the second substrate member to come in contact with the protruding portion in a pressed state, to be disposed around the protruding portion in the pressed state. The ultrasonically welding includes a first process for applying ultrasonic vibration at amplitude as a first value to the first substrate member, and a second process for applying ultrasonic vibration to the first substrate member at amplitude as a second value lower than the first value after the first process.

12 Claims, 9 Drawing Sheets

(51) Int. Cl.
*B01L 3/00* (2006.01)
*B29C 65/78* (2006.01)
*B29C 65/00* (2006.01)
*B81C 3/00* (2006.01)
B29L 31/00 (2006.01)
B29L 22/00 (2006.01)

(52) U.S. Cl.
CPC ......... *B29C 66/112* (2013.01); *B29C 66/114* (2013.01); *B29C 66/1122* (2013.01); *B29C 66/242* (2013.01); *B29C 66/30223* (2013.01); *B29C 66/53461* (2013.01); *B29C 66/73365* (2013.01); *B29C 66/8322* (2013.01); *B29C 66/942* (2013.01); *B29C 66/944* (2013.01); *B29C 66/9492* (2013.01); *B29C 66/9516* (2013.01); *B29C 66/9517* (2013.01); *B81C 3/001* (2013.01); *B01L 2200/0689* (2013.01); *B01L 2300/0816* (2013.01); *B01L 2300/0887* (2013.01); *B29C 66/71* (2013.01); *B29C 66/73366* (2013.01); *B29C 66/73921* (2013.01); *B29L 2022/00* (2013.01); *B29L 2031/756* (2013.01); *B81C 2203/038* (2013.01)

(58) Field of Classification Search
CPC .............. B29C 66/942; B29C 66/9516; B29C 66/8322; B29C 66/30223; B29C 66/73365; B29C 66/242; B29C 66/944; B29C 66/114; B29C 66/112; B29C 66/1122; B29C 66/73921; B29C 66/71; B29C 66/73366; B81C 3/001; B81C 2203/038; B01L 3/502707; B01L 2200/0689; B01L 2300/0816; B01L 2300/0887; B29L 2022/00; B29L 2031/756
USPC ....................... 156/64, 73.1, 350, 580, 580.1
See application file for complete search history.

(56) References Cited

FOREIGN PATENT DOCUMENTS

| JP | 11-20024 A | 1/1999 |
|---|---|---|
| JP | 2002-536210 A | 10/2002 |
| JP | 2006-204983 A | 8/2006 |
| JP | 2011-161578 A | 8/2011 |

OTHER PUBLICATIONS

Japanese Office Action and English translation dated Jan. 5, 2016 for corresponding Application No. 2013-269638.

BONDING METHOD AND METHOD OF MANUFACTURING MICROCHANNEL DEVICE

CROSS-REFERENCE TO RELATED APPLICATIONS

This application is based on and claims priority wider 35 USC 119 from Japanese Patent Application No. 2013-269638 filed on Dec. 26, 2013, the entire content of which is incorporated herein by reference.

BACKGROUND

1. Technical Field

The present invention relates to a bonding method and a method of manufacturing a microchannel device.

2. Related Art

A microchannel device has recently been used for analysis of a liquid sample. The microchannel device is configured to pass samples or other liquids through a microchannel to cause chemical or biochemical reactions in the microchannel so that a detection target substance included in a sample is detected.

A microchannel device is typically configured by stacking a plurality of substrate members so that a channel is formed between two adjacent substrate members. The two substrate members which form the channel are typically bonded by, for example, an adhesive tape. Also, there is known a microchannel in which two substrate members are bonded by ultrasonic welding in order to increase a sealing property of the channel (e.g., See, Patent Literature 1 (JP-A-2011-161578)).

In a method of manufacturing a microchannel device disclosed in Patent Literature 1, two substrate members (a substrate member formed with a protruding portion and a stopper and a flat substrate member) are stacked and applied with ultrasonic vibration under a predetermined pressurization condition so that the protruding portion is gradually welded on the surface of the flat substrate member. In this method, when the stopper and the flat substrate member come in contact with each other as the welding proceeds, the ultrasonic vibration is stopped, and a space sandwiched between the protruding portion and the substrate member is formed as a channel.

There are known various technologies for ultrasonic bonding. Patent Literature 2 (JP-A-3-183527) discloses a method of allowing bonding to be performed within a short time without reducing a bonding strength by gradually decreasing amplitude of ultrasonic waves from initiation of bonding when semiconductor chips are bonded by using an adhesive.

Patent Literature 3 (JP-A-2006-204983) discloses a method of easily and inexpensively manufacturing a microreactor in which a condition of a member pressing pressure with respect to oscillation energy and oscillation time is set to a desired value in ultrasonic oscillation.

As disclosed in Patent Literature 1, in a method of defining a height of a channel by using a stopper, when the stopper and a flat substrate member come in contact with each other in a larger area than a contact area between a protruding portion and the flat substrate member, a resistance between substrate members is increased. As a result, energy of ultrasonic oscillation is hardly transmitted to the protruding portion so that the welding of the protruding portion may be stopped.

Accordingly, in order to make the height of the microchannel uniform, it is required to bring substrate members in contact with each other at once over the all locations of a stopper. However, a microchannel device has one side length on the order of centimeters. Accordingly, the substrate members may not come in contact with each other at once over the all locations of the stopper due to, for example, warpage of the substrate members. In such a case, due to a resistance increase caused by contact between the stopper and the substrate member, welding of a protruding portion is stopped early. Accordingly, the height of the microchannel may not be uniform.

Patent Literatures 1 to 3 do not consider a problem in that welding of a protruding portion is early stopped by using a stopper, and the height of a channel becomes non-uniform, and thus do not disclose a means for solving the problem.

The present invention has been made in view of the above described circumstances, and an object thereof is to provide a bonding method in which a protruding portion for bonding two members to each other through ultrasonic welding may be welded without non-uniformity in height over the entire length of the protruding portion, and a method of manufacturing a microchannel device which may perform a control of a channel space with high precision.

An aspect of the present invention provides a bonding method of bonding a first substrate member to a second substrate member, the method comprising ultrasonically welding a protruding portion extending on a surface of the first substrate member to a surface of the second substrate member by applying ultrasonic vibration to the first substrate member in a state where a for portion of the protruding portion is pressed against the surface of the second substrate member, wherein a protruding stopper portion for stopping welding is provided on the surface of the first substrate member formed with the protruding portion, or on the surface of the second substrate member to come in contact with the protruding portion in the pressed state, to be disposed around the protruding portion in the pressed state, and the ultrasonically welding includes a first process for applying ultrasonic vibration at amplitude as a first value to the first substrate member, and a second process for applying ultrasonic vibration to the first substrate member at amplitude as a second value lower than the first value after the first process.

Another aspect of the present invention provides as manufacturing method of manufacturing a microchannel device in which a channel is formed between a first substrate member and a second substrate member which are bonded to each other, the method comprising: ultrasonically welding a protruding portion extending on a surface of the first substrate member to a surface of the second substrate member by applying ultrasonic vibration to the first substrate member in a state where a top portion of the protruding portion is pressed against the surface of the second substrate member, the protruding portion corresponding to an edge of the channel, wherein a protruding stopper portion for stopping welding is provided on the surface of the first substrate member formed with the protruding portion, or on the surface of the second substrate member to come in contact with the protruding portion in the pressed state to be disposed around the protruding portion in the pressed state, the ultrasonically welding includes a first process for applying ultrasonic vibration at amplitude as a first value to the first substrate member, and a second process for applying ultrasonic vibration to the first substrate member at amplitude as a second value lower than the first value after the first process.

According to the present invention, there is provided is bonding method in which a protruding portion for bonding two members to each other through ultrasonic welding may be welded without non-uniformity in height over the entire length of the protruding portion, and a method of manufacturing as microchannel device which may perform a control of as channel space with high precision.

DESCRIPTION OF EMBODIMENTS

Hereinafter, an exemplary embodiment of the present invention will be described with reference to drawings.

A microchannel device to be described below passes a liquid sample containing an antigen such as allergen, as a detection target substance, through the microchannel device. In the microchannel device, the antigen bound to a labeling substance which excites and emits light is captured within a channel, and light emission of the labeling substance bound to the captured antigen is observed, thereby detecting the antigen. However, the present invention is not limited thereto.

Figure 1:
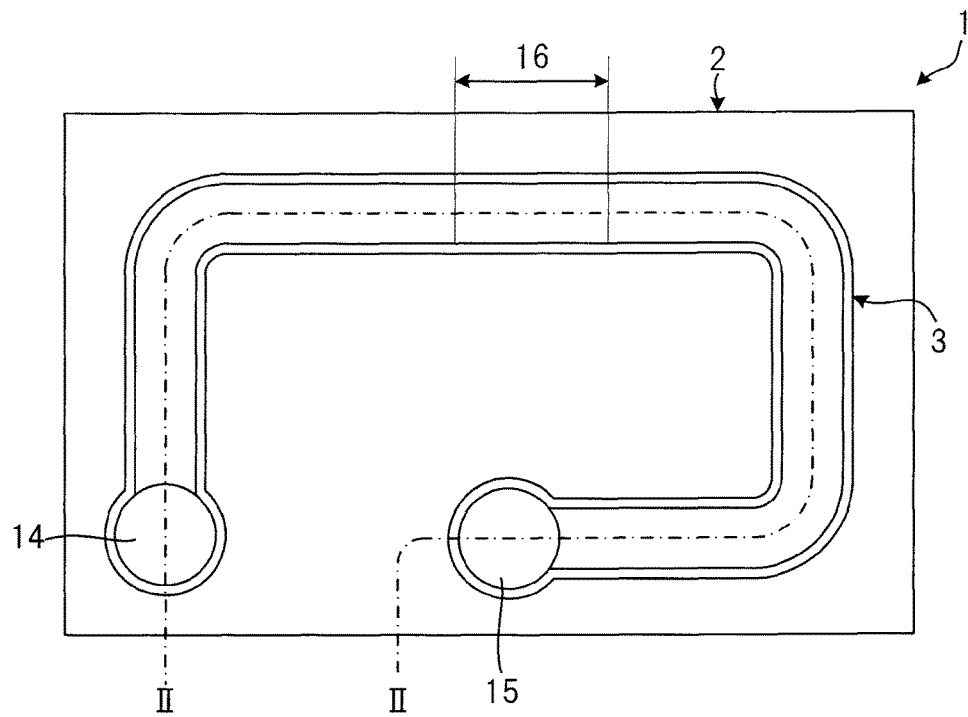
FIG. 1 is a plan view of a microchannel device 1 according to an exemplary embodiment of the present invention.
Figure 2:
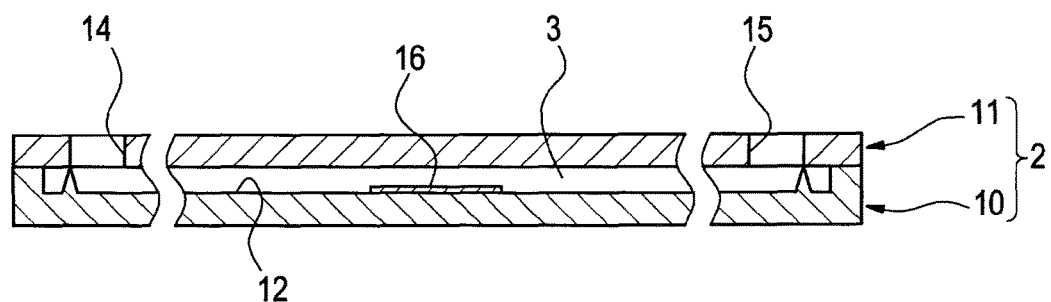
FIG. 2 is as cross-sectional view along line II-II of FIG. 1.

FIG. 1 is a plan view of a microchannel device 1 according to an exemplary embodiment of the present invention. FIG. 2 is a cross-sectional view along line II-II of FIG. 1.

The microchannel device 1 includes a substrate 2. The substrate 2 is configured by stacking and bonding two substantially rectangular substrate members 10 and 11 to each other. The microchannel device 1, as described above, is configured to detect an antigen by observing light emission of a labeling substance. Thus, at least one of the substrate members 10 and 11 is transparent. The substrate member 10 is a first substrate member, and the substrate member 11 is a second substrate member.

A bonding surface of the substrate member 10 to be bonded to the substrate member 11 is formed with a fine recessed portion 12 in a predetermined pattern. Two holes 14 and 15 are formed to penetrate the substrate member 11 in a thickness direction.

The substrate member 10 and the substrate member 11 are stacked with each other, and the substrate member 11 covers the recessed portion 12 of the substrate member 10 to form a channel 3 within the substrate 2. The hole 14 becomes an introducing hole communicated with one end of the channel 3 and configured to introduce a liquid, such as a sample, into the channel 3. The hole 15 becomes a discharge hole communicated with the other end of the channel 3 and configured to discharge the liquid which has flowed in the channel 3.

A detection portion 16 is provided in the substantially central section in the channel 3. The detection portion 16 is provided with a detection unit configured to detect a detection target substance included in a sample. The microchannel device 1 is, as described above, configured to capture an antigen within a channel and detect the antigen. Thus, an antibody that specifically adsorbs and captures an antigen is fixed to the detection portion 16.

A method of detecting an antigen such as allergen by using the microchannel device 1 configured as described above will be briefly described.

A liquid sample containing an antigen is subjected to pre-treatment in which a labeling substance which excites and emits light is bound to the antigen, and the sample which has been subjected to the pre-treatment is injected into the introducing hole 14. A vacuum pump is connected to the discharge hole 15, thereby making a pressure difference between the introducing hole 14 and the discharge bole 15, so that the sample injected into the introducing hole 14 is drawn into the channel 3. While the sample is flowed in the detection portion 16, the antigen included in the sample is specifically adsorbed and captured by the antibody fixed to the surface of the detection portion 16. Excitation light is irradiated to the detection portion 16 to observe light emission of the labeling substance bound to the antigen captured by the detection portion 16. The antigen included in the sample is detected from the presence or absence of light emission, or the intensity of light emission.

In the above description, the labeling substance is bound to the antigen by the pre-treatment. However, a reaction portion may be provided at an upstream section of the detection portion 16 in the channel 3, and then, a labeling substance may be attached to the surface of the reaction portion, or a carrier carrying the labeling substance may be disposed on the surface of the reaction portion. Accordingly, while a sample flows in the reaction portion, the labeling substance may be bound to the antigen included in the sample.

As described above, feeding of the sample is made by pressure. A leakage of the sample has an effect on detection accuracy. Therefore, a high sealing property is required for the channel 3. Accordingly, the two substrate members 10 and 11 which form the channel 3 are bonded by ultrasonic welding.

Figure 3:
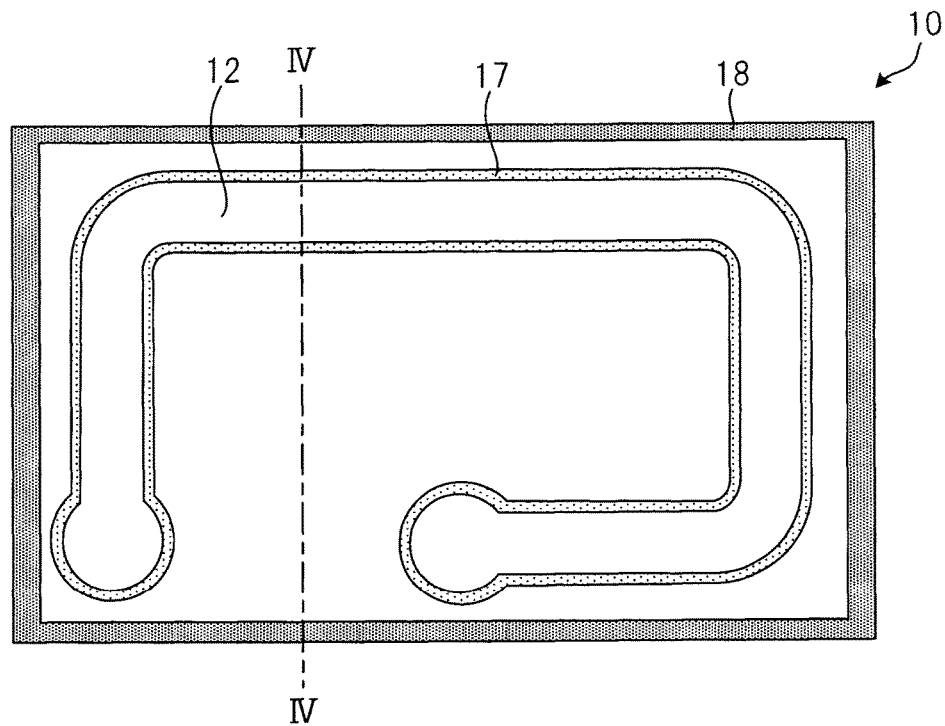
FIG. 3 is a plan view of a substrate member 10 provided with a protruding portion to be ultrasonically welded.
Figure 4:
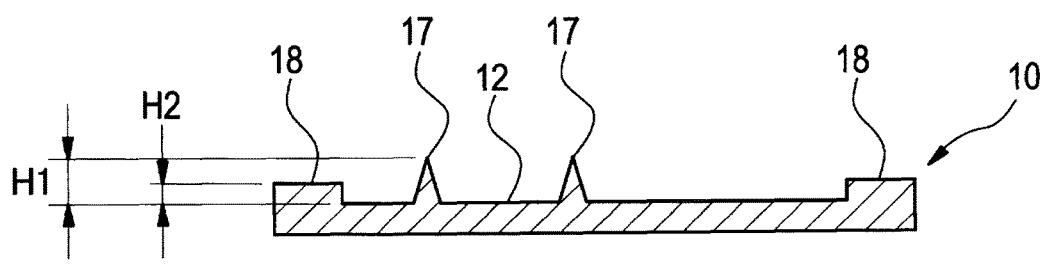
FIG. 4 is a cross-sectional view along line IV-IV of FIG. 3.

FIG. 3 is a plan view of the substrate member 10 provided with a protruding portion to be ultrasonically welded. FIG. 4 is a cross-sectional view along line IV-IV of FIG. 3.

In the microchannel device 1, a protruding portion 17 to be ultrasonically welded extends on the surface of the substrate member 10. A protruding stopper portion 18 for stopping welding is provided on the surface of the substrate member 10 provided with the protruding portion 17 and is disposed around the protruding portion 17.

The protruding portion 17 protrudes from the surface of the substrate member 10 by a predetermined height H1 and extends to define the recessed portion 12 which becomes the channel 3. That is, the recessed portion 12 is formed by the protruding portion 17, and the protruding portion 17 surrounds the recessed portion 12 along the edge of the recessed portion 12.

The protruding portion 17 comes in contact with the substrate member 11 at the top of the protruding portion 17. The top portion of the protruding portion 17 is melted and is adhered on the substrate member 11 as ultrasonic vibration is applied. The cross-section of the protruding portion 17 is preferably formed into a shape having a pointed top portion, and typically into a triangular shape so that ultrasonic vibration is concentrated on the top portion.

The stopper portion 18 extends along the outer periphery of the surface of the substrate member 10 formed with the protruding portion 17. The stopper portion 18 protrudes from the surface of the substrate member 10 by a predetermined height H2. The height H2 of the stopper portion 18 is smaller than the height H1 of the protruding portion 17. The area of the top portion of the stopper portion 18 in plan view is sufficiently larger than the area of the protruding portion 17 of the microchannel device 1 in plan view.

According to the progress of ultrasonic welding, the top portion of the protruding portion 17 is welded and lowered, so that the stopper portion 18 comes in contact with the substrate member 11. Accordingly, the ultrasonic vibration is dispersed, and the welding of the top portion of the protruding portion 17 is stopped. That is, the stopper portion 18 defines the height of the protruding portion 17 left after the ultrasonic welding. That is, the stopper portion 18 defines the depth of the recessed portion 12 defined by the protruding portion 17, and finally defines the thickness of the channel 3.

Hereinafter, an exemplary method of manufacturing the microchannel device 1 will be described.

As for a material for the substrate members 10 and 11, a thermoplastic resin is appropriately used. For example, the protruding portion 17 or the stopper portion 18 may be formed by injecting a resin into a form of the pattern of the protruding portion 17 or the stopper portion 18, and solidifying the injected resin. Otherwise, the protruding portion 17 or the stopper portion 18 may be formed by performing a hot-emboss process in the pattern of the protruding portion 17 or the stopper portion 18, on a flat resin plate.

Examples of the thermoplastic resin used for the material for the substrate members 10 and 11 may include a polyolefin-based resin such as a polyethylene resin or a polypropylene resin, a polystyrene-based resin, a polylactic acid-based resin, a polyacrylic resin such as polymethylmethacrylate, and a silicon-based resin such as polycarbonate. In order to circulate various liquids, as polyolefin-based resin excellent in, for example, acid resistance, alkali resistance, and chemical resistance is preferable. In order to observe light emission of the labeling substance, a polyolefin-based resin excellent in optical transparency is preferable.

Antibodies are fixed at predetermined locations of the recessed portion 12 defined by the protruding portion 17 of the substrate member 10. For example, a gold thin film is deposited by sputtering, and a solution containing an antibody is quantitatively spotted on the gold thin film by a dispenser, so that the antibody is bound to the gold thin film. Further, a blocking agent is additionally spotted thereto in order to suppress the labeling substance alone from being non-specifically adsorbed by the antibody. An immune stabilizer containing a protein as a main component is further spotted thereto so as to moisturize and stabilize the antibody. These are dried and the antibodies are fixed at predetermined locations of the recessed portion 12. The locations constitute the detection portion 16 in the channel 3.

Subsequently, the substrate members 10 and 11 are bonded by ultrasonic welding to obtain the microchannel device 1.

Figure 5A:
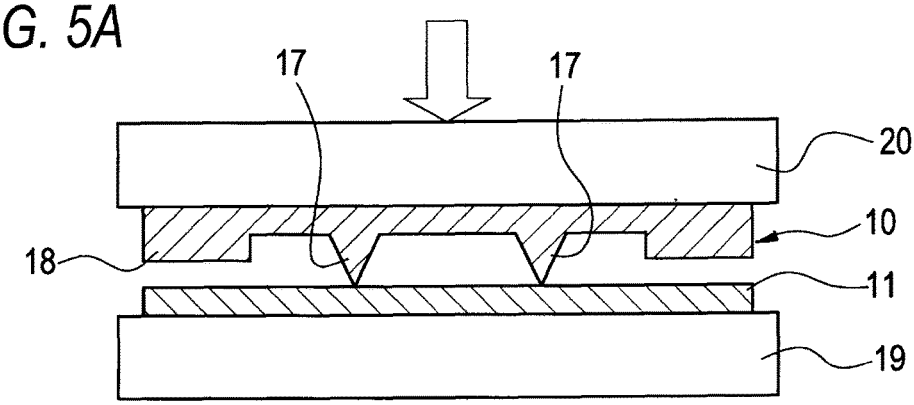
FIGS. 5A to 5C are views illustrating a process of bonding two substrate members to each other by ultrasonic welding.
Figure 5B:
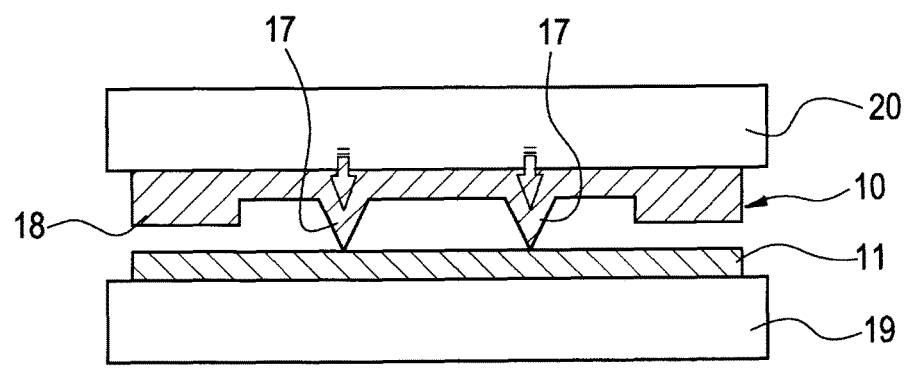
Figure 5C:
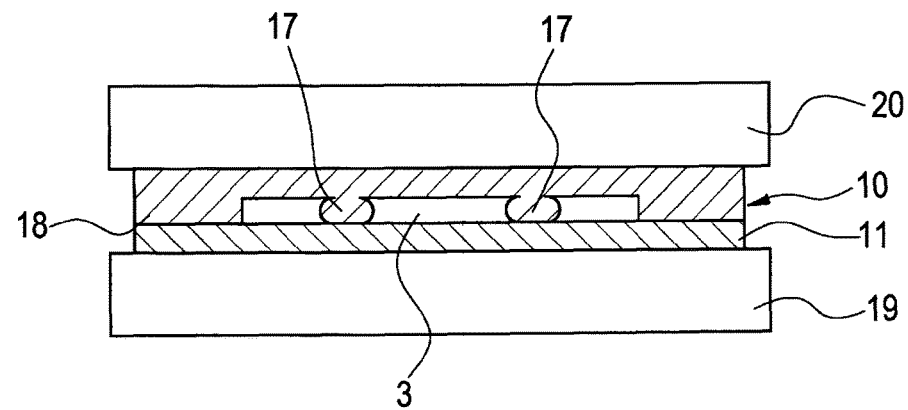

FIGS. 5A to 5C are views illustrating a process of bonding two substrate members to each other by ultrasonic welding.

The substrate member 11 is placed on a bearing block 19, and the substrate member 10 formed with the protruding portion 17 is stacked on the substrate member 11 so that the top portion of the protruding portion 17 comes in contact with the surface of the substrate member 11. An ultrasonic oscillation horn 20 which is a part of an ultrasonic oscillation device is stacked on the substrate member 10 to pressurize a stacked body of the substrate members 10 and 11 between the bearing block 19 and the horn 20 (FIG. 5A). Accordingly, the top portion of the protruding portion 17 extending on the surface of the substrate member 10 is pressed against the surface of the substrate member 11.

A load applied to the stacked body of the substrate members 10 and 11 is generally gradually increased. When the load applied to the stacked body is equal to or greater than a predetermined threshold, ultrasonic oscillation is initiated from the horn 20, and ultrasonic vibration is applied to the substrate member 10 to initiate welding of the protruding portion 17 to the substrate member 11 (FIG. 5B). The above described threshold related to the load applied to the stacked body of the substrate members 10 and 11 may be set as a load which allows the protruding portion 17 to be in contact with a bonding surface of the substrate member 11 over the entire length of the protruding portion 17.

Here, amplitude of ultrasonic vibration at the initiation time of the ultrasonic vibration (amplitude of vibration applied to the substrate member 10 from the ultrasonic oscillation horn 20) is set as a first value. An ultrasonic oscillation device includes a converter configured to generate vibration, a booster configured to amplify the vibration generated by the converter, and an ultrasonic oscillation horn configured to transfer the vibration amplified by the booster to a member. Here, a voltage applied to the converter is adjusted to adjust the amplitude of vibration applied to the substrate member 10 from the ultrasonic oscillation horn 20.

The height of the protruding portion 17 is lowered as the protruding portion 17 is melted with the progress of ultrasonic welding. Then, when a predetermined time is elapsed from the initiation of the ultrasonic vibration, the amplitude is changed to a second value lower than the first value.

In this manner, a process of applying ultrasonic vibration to the substrate member 10 to weld the protruding portion 17 on the surface of the substrate member 11 includes a first ultrasonic welding process of applying the ultrasonic vibration at amplitude of the first value to the substrate member 10, and a second ultrasonic welding process of applying the ultrasonic vibration at amplitude of the second value lower than the first value to the substrate member 10 after the first ultrasonic welding process is performed.

After the amplitude is changed to the second value, when the stopper portion 18 comes in contact with the substrate member 11 at all locations, the ultrasonic vibration is dispersed to stop the welding of the protruding portion 17. The height of the protruding portion 17 becomes substantially the same as the height of the stopper portion 18, which becomes the height of the channel 3 (FIG. 5C).

In the obtained microchannel device 1, the boundary between the two substrate members 10 and 11, which is exposed in the channel 3, is closed over the entire length by ultrasonic welding of the protruding portion 17. The ultrasonic welding of the protruding portion 17 is performed in a state where the protruding portion 17 is in contact with the bonding surface of the substrate member 11 over the entire length of the protruding portion 17. Accordingly, the ultrasonic welding is uniformly performed over the entire length of the protruding portion 17, the sealing property of the channel 3 is improved, and the bonding strength of the substrate members 10 and 11 is also improved.

The length of the contact portion between the stopper portion 18 and the substrate member 11 in the cross-section passing through the stopper portion 18 and the protruding portion 17 becomes 3 times to 20 times the length of the protruding portion 17 welded on the substrate member 11 in the cross-section in a state where the welding of the protruding portion 17 is stopped. The shapes of the stopper portion 18 and the protruding portion 17 may be determined to obtain the relationship so that the shape control of the channel 3 may be performed with high precision.

Here, a time for performing the first ultrasonic welding process (the predetermined time) will be described.

When the substrate member 10 is bonded to the substrate member 11, the amplitude of ultrasonic vibration is generally set as a large value to some extent so as to shorten a time required for bonding, or increase a bonding strength. Specifically, the amplitude of the ultrasonic vibration may be set as a value as large as possible as long as the substrate member 10 and the substrate member 11 are not destroyed.

However, the inventor found that when the substrate member 10 and the substrate member 11 are welded to each other at fixed large amplitude of ultrasonic vibration, the welding may be stopped in a state where the height of the protruding portion 17 is larger than a desired value at some locations of the substrate member. This may be because according to the high amplitude of the ultrasonic vibration, energy of ultrasonic vibration is easily dispersed into the stopper portion 18 due to a resistance increase caused by contact between the stopper portion 18 and the substrate member 11.

Accordingly, in the present exemplary embodiment, a process of measuring a time required until a variation of height of the protruding portion 17 becomes a threshold or less is performed while gradually welding the protruding portion 17 on the surface of the substrate member 11 by applying ultrasonic vibration at amplitude of the first value to the substrate member 10 before the microchannel device 1 is manufactured. The time for performing the first ultrasonic welding process is set as a time longer than the time measured by the measuring process.

Specifically, before the microchannel device 1 is manufactured, a substrate member 10 and a substrate member 11 manufactured in the same designs as those used for manufacturing the microchannel device 1 are prepared. The substrate member 11 is placed on a bearing block 19, and the substrate member 10 formed with a protruding portion 17 is stacked on the substrate member 11 so that the top portion of the protruding portion 17 comes in contact with the surface of the substrate member 11. Subsequently, an ultrasonic oscillation horn 20 is stacked on the substrate member 10 to pressurize a stacked body of the substrate members 10 and 11 between the bearing block 19 and the horn 20. When the load applied to the stacked body is equal to or greater than a predetermined threshold, ultrasonic oscillation is initiated from the horn 20, and ultrasonic vibration at amplitude of a first value is applied to the substrate member 10 to initiate welding of the protruding portion 17 to the substrate member 11.

During the welding, the height of a channel formed by the protruding portion 17 is measured at each of locations at a plurality of different distances from an end portion of the stacked body of the substrate member 10 and the substrate member 11. The measurement of the height of the channel is performed by measuring an optical path difference between laser reflected lights from two surfaces, that is, a channel side surface of the substrate member 10 and a channel side surface of the substrate member 11 through, for example, a laser displacement gauge.

Then, a time from welding initiation until a variation of each of the protruding portion heights measured at all locations becomes a threshold or less is measured. The predetermined time as described above is set to be longer than the time measured in this manner. In this manner, a time required for bonding substrate members may be shortest, and the bonding strength of the substrate members may be increased while the height of the protruding portion 17 may become uniform.

A second value set as amplitude of ultrasonic vibration may be properly set as a value at which welding is resumed. However, it is preferable that the second value is 0.5 times or less the first value so that once welding is stopped, the welding is smoothly and securely resumed.

So far, the stopper portion 18 provided in the substrate member 10 is provided along the outer periphery of the substrate member 10. However, the configuration of the stopper portion 18 is not limited thereto.

Figure 6:
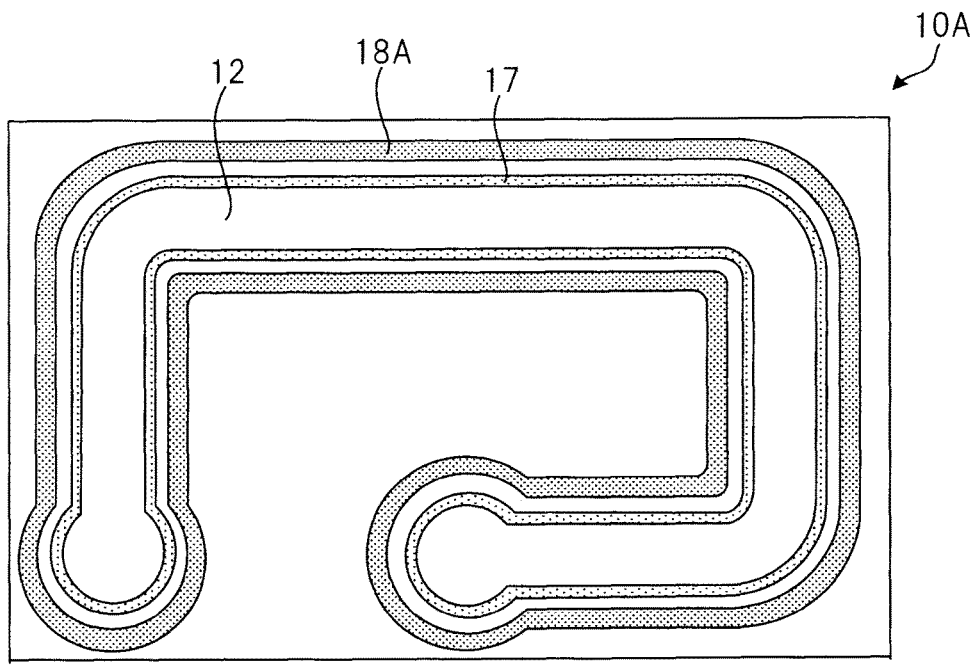
FIG. 6 is a plan view of a substrate member 10A which is a modified example of the substrate member 10 of the microchannel device 1 illustrated in FIG. 1.

FIG. 6 is a plan view of a substrate member 10A which is a modified example of the substrate member 10 of the microchannel device 1 illustrated in FIG. 1.

The substrate member 10A is different from the substrate member 10 in that a stopper portion 18A corresponding to the stopper portion 18 extends along the protruding portion 17 at the side of the protruding portion 17. Here, in a preferred aspect, the stopper portion extends along the protruding portion such that the width of the stopper portion is constant within an error range of 50%, an interval separating the stopper portion and the protruding portion is equal to or less than the width of the stopper portion, and the width of the protruding portion is constant within an error range of 50%. Accordingly, when the microchannel device 1 is manufactured by using the substrate member 10A, a distance between the protruding portion 17 and the stopper portion 18A becomes shorter and constant, and thus the shape control of the channel 3 may be performed with higher precision.

Figure 7:
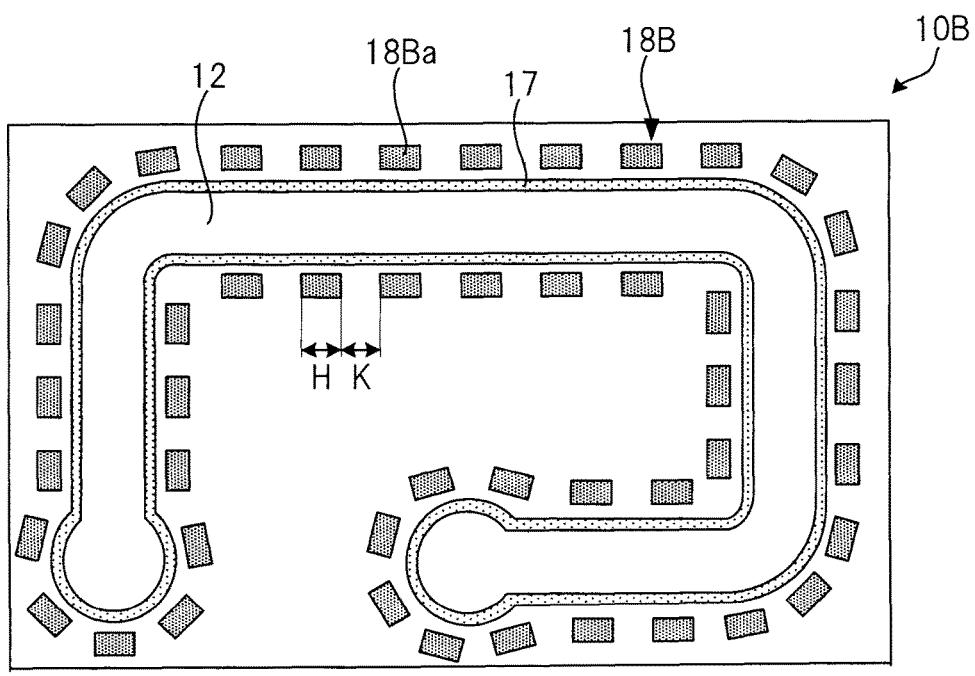
FIG. 7 is a plan view of a substrate member 10B which is a modified example of the substrate member 10 of the microchannel device 1 illustrated in FIG. 1.

FIG. 7 is a plan view of a substrate member 10B which is a modified example of the substrate member 10 of the microchannel device 1 illustrated in FIG. 1.

The substrate member 10B is the same as the substrate member 10A in that a stopper portion 18B corresponding to the stopper portion 18 extends along the protruding portion 17 at the side of the protruding portion 17, but is different from the substrate member 10A in that the stopper portion 18B is constituted by a plurality of sub-protruding portions 18Ba arranged at intervals.

According to the substrate member 10B, a distance between the protruding portion 17 and the stopper portion 18B becomes shorter and constant, and thus the shape control of the channel 3 may be performed with higher precision. When the length of each of the sub-protruding portions 18Ba in the arrangement direction of the plurality of sub-protruding portions 18Ba is set as H, and the interval between the sub-protruding portions 18Ba in the arrangement direction is set as K, H/K may be set as 0.5 or more so that the shape control of the channel 3 may be performed with higher precision.

In the above description, the stopper portion 18, 18A or 18B is provided on the surface of the substrate member 10 provided with the protruding portion 17, but the stopper portion 18, 18A or 18B may be provided on the substrate member 11. That is, the stopper portion 18, 18A or 18B may be provided on the surface of the substrate member 11 to come in contact with the protruding portion 17 so that the stopper portion 18, 18A or 18B is disposed around the protruding portion 17 in a state where the top portion of the protruding portion 17 is pressed against the surface of the substrate member 11.

Hereinafter, Examples of the present invention will be described. In the following Examples, as for an ultrasonic welding machine used for bonding two substrate members, a machine manufactured by Japan Emerson Co., Ltd. was used. An oscillator model 2000 Xdt (20:1.25) was used, an actuator model aed2.5 was used, and a converter CJ-20 was used.

COMPARATIVE EXAMPLE 1

Figure 8:
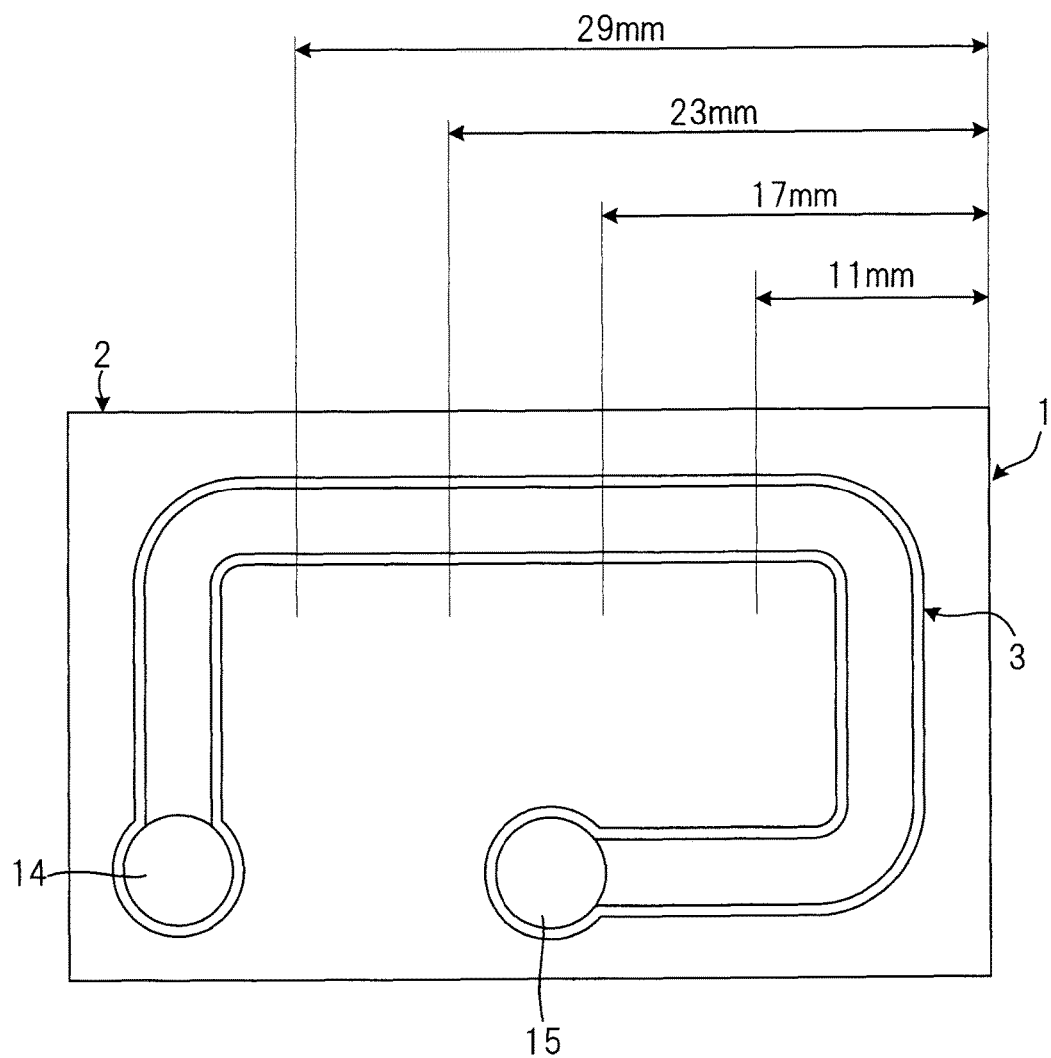
FIG. 8 is a plan view of a microchannel device manufactured by Examples.

A microchannel device configured as illustrated in FIG. 1 was manufactured by the method described in FIGS. 5A to 5C. However, the amplitude of the ultrasonic vibration applied to the substrate member 10 was constant without a change on the way. The amplitude of the ultrasonic vibration applied to the substrate member 10 was set as 40% of maximum amplitude of vibration which can be applied by an ultrasonic welding machine. In the microchannel device during the manufacturing, as illustrated in FIG. 8, the height of a channel was measured with respect to time elapsed from initiation of the ultrasonic vibration at each of locations at distances 11 mm, 17 mm, 23 nun and 29 mm from an end portion of a substrate 2.

Figure 9:
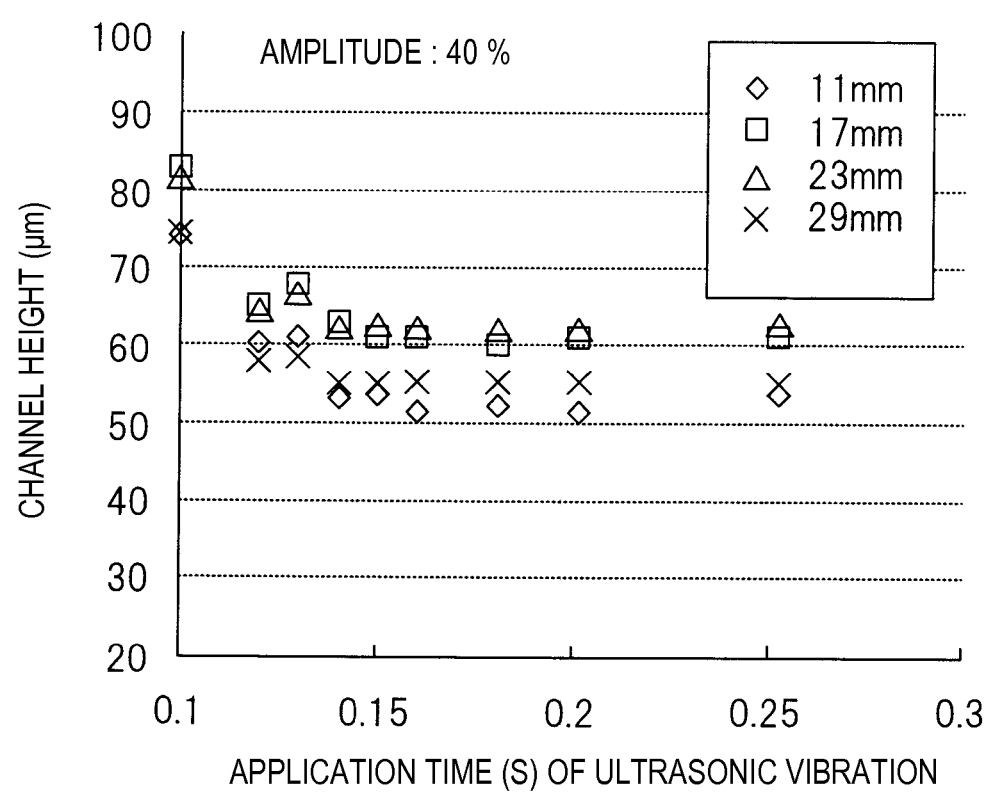
FIG. 9 is a view illustrating a change of a channel height in the microchannel device manufactured in Comparative Example 1.

FIG. 9 is a view illustrating a measurement result of the height of the channel in the manufacturing process of the microchannel device of Comparative Example 1. As illustrated in FIG. 9, when the ultrasonic vibration at 40% of maximum amplitude was continuously applied, 0.15 sec later, a height variation of the channel at each location was reduced but the heights of the channel did not become uniform at all locations, thereby stopping welding.

EXAMPLE 1

A microchannel device configured as illustrated in FIG. 1 was manufactured by the method described in FIGS. 5A to 5C. The amplitude of the ultrasonic vibration applied to the substrate member 10 was set as 40% of maximum amplitude (a first value), and 20% of maximum amplitude (a second value). The amplitude was set as the first value for about 0.17 sec which is much longer than 0.15 sec, that is, the time consumed until the welding was stopped in FIG. 9. In the same manner as in Comparative Example 1, in the microchannel device during the manufacturing, the height of a channel was measured with respect to time elapsed from initiation of the ultrasonic vibration.

Figure 10:
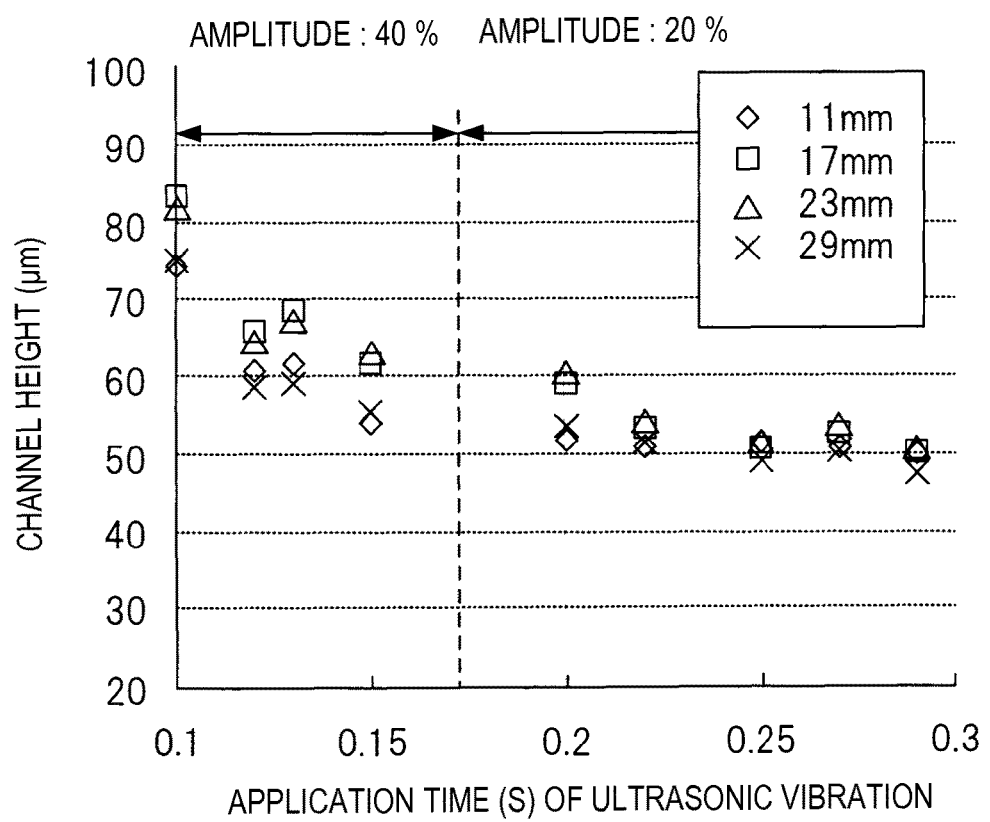
FIG. 10 is a view illustrating a change of a channel height in the microchannel device manufactured in Example 1.

FIG. 10 is a view illustrating a measurement result of the height of the channel in the manufacturing process of the microchannel device of Example 1. As illustrated in FIG. 10, when the amplitude was reduced from 40% of maximum amplitude to 20% in the middle of welding, the heights of the channel were gradually reduced at locations of 17 mm, 23 mm and. 29 mm, and then the heights of the channel became uniform at all locations at about 0.3 sec.

COMPARATIVE EXAMPLE 2

The microchannel device was manufactured in the same mariner as in Comparative Example 1 except that the amplitude of the ultrasonic vibration applied to the substrate member 10 was set as 60% of maximum amplitude of vibration which can be applied by an ultrasonic welding machine, and the height of a channel was measured with respect to time elapsed from initiation of the ultrasonic vibration.

Figure 11:
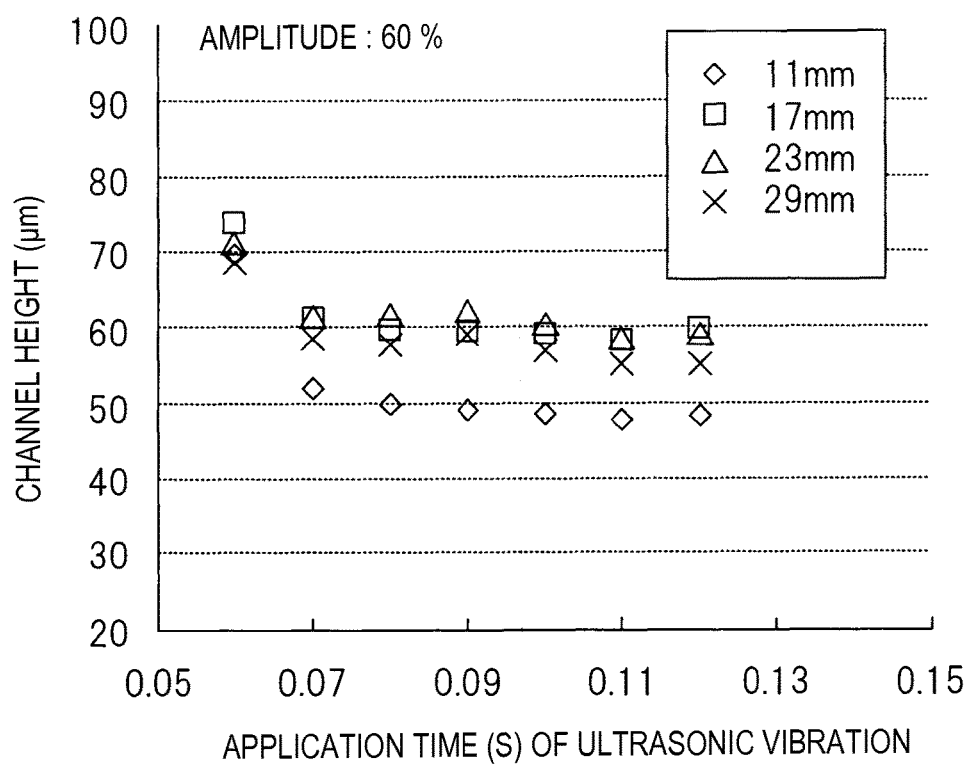
FIG. 11 is a view illustrating a change of a channel height in the microchannel device manufactured in Comparative Example 2.

FIG. 11 is a view illustrating a measurement result of the height of the channel in the manufacturing process of the microchannel device of Comparative Example 2. As illustrated in FIG. 11, when the ultrasonic vibration at 60% of maximum amplitude was continuously applied, 0.07 sec later, a height variation of the channel at each location was reduced but the heights of the channel did not become uniform at all locations, thereby stopping welding.

EXAMPLE 2

A microchannel device configured as illustrated in FIG. 1 was manufactured by the method described in FIGS. 5A to 5C. The amplitude of the ultrasonic vibration applied to the substrate member 10 was set as 60% of maximum amplitude (a first value), and 10% of maximum amplitude (a second value). The amplitude was set as the first value for 0.07 sec Which is the time consumed until the welding was stopped in FIG. 11. In the same manner as in Comparative Example 2, in the microchannel device during the manufacturing, the height of a channel was measured with respect to time elapsed from initiation of the ultrasonic vibration.

Figure 12:
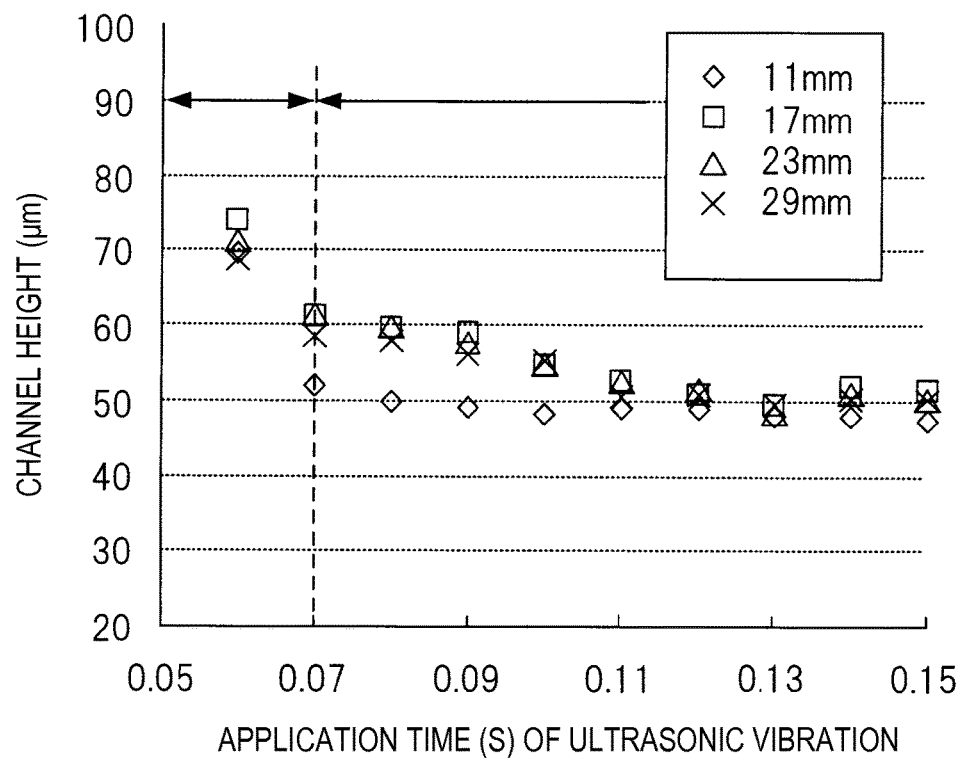
FIG. 12 is a view illustrating a change of a channel height in the microchannel device manufactured in Example 2.

FIG. 12 is a view illustrating a measurement result of the height of the channel in the manufacturing process of the microchannel device of Example 2. As illustrated in FIG. 12, when the amplitude was reduced from 60% of maximum amplitude to 10% in the middle of welding, the heights of the channel were gradually reduced at locations of 17 mm, 23 mm and. 29 mm, and then the heights of the channel became uniform at all locations at about 0.13 sec.

As described above, when the second value is set to be 0.5 times or less the first value, the resumption of welding may be smoothly and accurately performed even after the welding of the protruding portion 17 has stopped.

As described above, in the present specification, the following items are disclosed.

It is disclosed a bonding method of bonding a first substrate member to a second substrate member, the method including ultrasonically welding a protruding portion extending on a surface of the first substrate member to a surface of the second substrate member by applying ultrasonic vibration to the first substrate member in a state where a top portion of the protruding portion is pressed against the surface of the second substrate member, in which a protruding stopper portion for stopping welding is provided on the surface of the first substrate member formed with the protruding portion, or on the surface of the second substrate member to come in contact with the protruding portion in the pressed state, to be disposed around the protruding portion in the pressed state, and the ultrasonically welding includes a first process for applying ultrasonic vibration at amplitude as a first value to the first substrate member, and a second process for applying ultrasonic vibration to the first substrate member at amplitude as a second value lower than the first value after the first process.

It is disclosed the bonding method, in which the stopper portion is disposed along the protruding portion at a side portion of the protruding portion in the pressed state.

It is disclosed the bonding method, in which the stopper portion is constituted by a plurality of sub-protruding portions arranged at intervals, in which when a length of each of the plurality of the sub-protruding portions in an arrangement direction of the sub-protruding portions is set as H, and an interval between the sub-protruding portions in the arrangement direction is set as K, H/K is set as 0.5 or more.

It is disclosed the bonding method, in which a length of a contact portion between the stopper portion and the first substrate member or the second substrate member in a cross-section passing through the stopper portion and the protruding portion in a state where the ultrasonically welding is stopped is 3 times to 20 times a length of the protruding portion welded on the second substrate member in the cross-section in a state where the ultrasonically welding is stopped.

It is disclosed the bonding method, in which the second value is 0.5 times or less the first value.

It is disclosed the bonding method, further including, before the ultrasonically welding, previously measuring a time required until a variation of height of a protruding portion extending on a surface of a third substrate member having the same configuration as the first substrate member becomes a threshold or less while welding the protruding portion on a surface of a fourth substrate member having the same configuration as the second substrate member by applying ultrasonic vibration at amplitude as the first value to the third substrate member in a state where a top portion of the protruding portion is pressed against the surface of the fourth substrate member, in which in the ultrasonically welding, the first process is performed for a time longer than the time measured in the measuring of the time.

It is disclosed a manufacturing method of manufacturing as microchannel device in which a channel is formed between a first substrate member and a second substrate member which are bonded to each other, the method including: ultrasonically welding a protruding portion extending on a surface of the first substrate member to a surface of the second substrate member by applying ultrasonic vibration to the first substrate member in a state where a top portion of the protruding portion is pressed against the surface of the second substrate member, the protruding portion corresponding to an edge of the channel, in which a protruding stopper portion for stopping welding is provided on the surface of the first substrate member formed with the protruding portion, or on the surface of the second substrate member to come in contact with the protruding portion in the pressed state to be disposed around the protruding portion in the pressed state, and the ultrasonically welding includes a first process for applying ultrasonic vibration at amplitude as a first value to the first substrate member, and a second process for applying ultrasonic vibration to the first substrate member at amplitude as a second value lower than the first value after the first process.

It is disclosed the manufacturing method, in which the stopper portion is disposed along the protruding portion at a side portion of the protruding portion in the pressed state.

It is disclosed the manufacturing method, in which the stopper portion is constituted by a plurality of sub-protruding portions arranged at intervals, in which when a length of each of the plurality of the sub-protruding portions in an arrangement direction of the sub-protruding portions is set as H, and an interval between the sub-protruding portions in the arrangement direction is set as K, is set as 0.5 or more.

It is disclosed the manufacturing method, in which a length of a contact portion between the stopper portion and the first substrate member or the second substrate member in a cross-section passing through the stopper portion and the protruding portion in a state where the ultrasonically welding is stopped is 3 times to 20 times a length of the protruding portion welded on the second substrate member in the cross-section in a state where the ultrasonically welding is stopped.

It is disclosed the manufacturing method, in which the second value is 0.5 times or less the first value.

It is disclosed the manufacturing method, further including, before the ultrasonically welding, previously measuring a time required until a variation of height of a protruding portion extending on a surface of a third substrate member having the same configuration as the first substrate member becomes a threshold or less while welding the protruding portion on a surface of a fourth substrate member having the same configuration as the second substrate member by applying ultrasonic vibration at amplitude as the first value to the third substrate member in a state where a top portion of the protruding portion is pressed against the surface of the fourth substrate member, in which in the ultrasonically welding, the first process is performed for a time longer than the time measured in the measuring of the time.

What is claimed is:

1. A bonding method of bonding a first substrate member to a second substrate member, the method comprising ultrasonically welding a protruding portion extending on a surface of the first substrate member to a surface of the second substrate member by applying ultrasonic vibration to the first substrate member in a state where a top portion of the protruding portion is pressed against the surface of the second substrate member,
    wherein a protruding stopper portion for stopping welding is provided on the surface of the first substrate member formed with the protruding portion, or on the surface of the second substrate member to come in contact with the protruding portion in the pressed state, to be disposed around the protruding portion in the pressed state, and
    the ultrasonically welding includes a first process for applying ultrasonic vibration at amplitude as a first value to the first substrate member, and a second process for applying ultrasonic vibration to the first substrate member at amplitude as a second value lower than the first value after the first process.

2. The bonding method of claim 1, wherein the stopper portion is disposed along the protruding portion at a side portion of the protruding portion in the pressed state.

3. The bonding method of claim 2, wherein the stopper portion is constituted by a plurality of sub-protruding portions arranged at intervals,
    wherein when a length of each of the plurality of the sub-protruding portions in an arrangement direction of the sub-protruding portions is set as H, and an interval between the sub-protruding portions in the arrangement direction is set as K, H/K is set as 0.5 or more.

4. The bonding method of claim 1, wherein a length of a contact portion between the stopper portion and the first substrate member or the second substrate member in a cross-section passing through the stopper portion and the protruding portion in a state where the ultrasonically welding is stopped is 3 times to 20 times a length of the protruding portion welded on the second substrate member in the cross-section in a state where the ultrasonically welding is stopped.

5. The bonding method of claim 1, wherein the second value is 0.5 times or less the first value.

6. The bonding method of claim 1, further comprising, before the ultrasonically welding, previously measuring a time required until a variation of height of a protruding portion extending on a surface of a third substrate member having the same configuration as the first substrate member becomes a threshold or less while welding the protruding portion on a surface of a fourth substrate member having the same configuration as the second substrate member by applying ultrasonic vibration at amplitude as the first value to the third substrate member in a state where a top portion of the protruding portion is pressed against the surface of the fourth substrate member, wherein in the ultrasonically welding, the first process is performed for a time longer than the time measured in the measuring of the time.

7. A manufacturing method of manufacturing a microchannel device in which a channel is formed between a first substrate member and a second substrate member which are bonded to each other, the method comprising:

ultrasonically welding a protruding portion extending on a surface of the first substrate member to a surface of the second substrate member by applying ultrasonic vibration to the first substrate member in a state where a top portion of the protruding portion is pressed against the surface of the second substrate member, the protruding portion corresponding to an edge of the channel, wherein a protruding stopper portion for stopping welding is provided on the surface of the first substrate member formed with the protruding portion, or on the surface of the second substrate member to come in contact with the protruding portion in the pressed state to be disposed around the protruding portion in the pressed state, and the ultrasonically welding includes a first process for applying ultrasonic vibration at amplitude as a first value to the first substrate member, and a second process for applying ultrasonic vibration to the first substrate member at amplitude as a second value lower than the first value after the first process.

8. The manufacturing method of claim 7, wherein the stopper portion is disposed along the protruding portion at a side portion of the protruding portion in the pressed state.

9. The manufacturing method of claim 8, wherein the stopper portion is constituted by a plurality of sub-protruding portions arranged at intervals, wherein when a length of each of the plurality of the sub-protruding portions in an arrangement direction of the sub-protruding portions is set as H, and an interval between the sub-protruding portions in the arrangement direction is set as K, H/K is set as 0.5 or more.

10. The manufacturing method of claim 7, wherein a length of a contact portion between the stopper portion and the first substrate member or the second substrate member in a cross-section passing through the stopper portion and the protruding portion in a state where the ultrasonically welding is stopped is 3 times to 20 times a length of the protruding portion welded on the second substrate member in the cross-section in a state where the ultrasonically welding is stopped.

11. The manufacturing method of claim 7, wherein the second value is 0.5 times or less the first value.

12. The manufacturing method of claim 7, further comprising, before the ultrasonically welding, previously measuring a time required until a variation of height of a protruding portion extending on a surface of a third substrate member having the same configuration as the first substrate member becomes a threshold or less while welding the protruding portion on a surface of a fourth substrate member having the same configuration as the second substrate member by applying ultrasonic vibration at amplitude as the first value to the third substrate member in a state where a top portion of the protruding portion is pressed against the surface of the fourth substrate member, wherein in the ultrasonically welding, the first process is performed for a time longer than the time measured in the measuring of the time.

\* \* \* \* \*